(12) United States Patent
Ishikawa et al.

(10) Patent No.: US 6,243,288 B1
(45) Date of Patent: Jun. 5, 2001

(54) GIANT MAGNETORESISTIVE SENSOR, THIN-FILM READ/WRITE HEAD AND MAGNETIC RECORDING APPARATUS USING THE SENSOR

(75) Inventors: Chiaki Ishikawa, Kokubunji; Kaori Totsuka, Mitaka; Yoshio Suzuki, Tokyo, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/642,003

(22) Filed: Aug. 21, 2000

(30) Foreign Application Priority Data

Aug. 26, 1999 (JP) .................................................. 11-239169

(51) Int. Cl.⁷ ................................ G11C 11/00; G11B 5/39
(52) U.S. Cl. ............................................. 365/158; 360/113
(58) Field of Search ........................... 365/158, 145, 365/171; 360/113

(56) References Cited

U.S. PATENT DOCUMENTS

| | | | |
|---|---|---|---|
| 5,206,590 | * | 4/1993 | Dieny et al. ............................ 360/113 |
| 5,465,185 | | 11/1995 | Heim et al. ............................ 360/113 |
| 5,583,725 | | 12/1996 | Coffey et al. ......................... 360/113 |
| 5,828,531 | * | 10/1998 | Gill ....................................... 360/113 |
| 5,883,764 | * | 3/1999 | Pinarbasi .............................. 360/113 |
| 5,910,344 | * | 7/1999 | Hasegawa et al. .................. 427/599 |
| 5,920,446 | * | 7/1999 | Gill ....................................... 360/113 |

FOREIGN PATENT DOCUMENTS

| | | |
|---|---|---|
| 5-347013 | 12/1993 | (JP) . |
| 7-169026 | 7/1995 | (JP) . |
| 7-225925 | 8/1995 | (JP) . |
| 8-7235 | 1/1996 | (JP) . |

OTHER PUBLICATIONS

B. Dieny et al, "Giant Magnetoresistance in Soft Ferromagnetic Multilayers", Physical Review B, vol. 43, No. 1, Jan. 1991, pp. 1297–1300.

M. Saito et al, "PtMn Dual Spin Valve Films Using Co/Ru/Co Synthetic Ferrimagnet Pinned Layers", Synopsis of the 22nd Lecture Meeting of Japan Institute of Applied Magnetism, 1998, p. 309.

* cited by examiner

Primary Examiner—Son T. Dinh
(74) Attorney, Agent, or Firm—Mattingly, Stanger & Malur, P.C.

(57) ABSTRACT

A giant magnetoresistive sensor which is improved in reproduction output and peak asymmetry of read-back waveform. It is composed of a first free ferromagnetic film, a first non-magnetic film, a composite ferromagnetic film, a second non-magnetic film, and a second free ferromagnetic film, which are laminated sequentially, but has no antiferromagnetic film to fix said composite ferromagnetic film, and said composite ferromagnetic film contains a first, second, and third ferromagnetic film, which are antiferromagnetically coupled with one another, and also contains films which separate said ferromagnetic films from one another and antiferromagnetically couple them with one another.

8 Claims, 10 Drawing Sheets

US 6,243,288 B1

GIANT MAGNETORESISTIVE SENSOR, THIN-FILM READ/WRITE HEAD AND MAGNETIC RECORDING APPARATUS USING THE SENSOR

BACKGROUND OF THE INVENTION

1. Field of the Invention

The present invention relates to a magnetic head to record and reproduce information on and from a magnetic recording medium, and more particularly to an improved giant magnetoresistive sensor and a magnetic recording/reproducing apparatus equipped with said sensor.

2. Description of the Related Art

The increasing magnetic recording density requires a highly sensitive magnetic head for reproduction. The one meeting this requirement is described in "Giant magnetoresistance in soft magnetic multi-layer film", Physical Review B, vol. 43, pp. 1297–1300. It is constructed such that two magnetic layers are separated by one nonmagnetic layer and an exchange bias magnetic field is applied to one of the magnetic layers from an antiferromagnetic layer. This type of multi-layer film has resistance R with a component varying in proportion to $\cos\theta$, with $\theta$ being an angle between the directions of magnetization of the two magnetic layers, according to the aforesaid thesis. This phenomenon is referred to as giant magnetoresistance (GMR).

A conventional giant magnetoresistive sensor is shown in FIG. 7. It consists of a substrate 5 and several layers sequentially formed thereon. Adjacent to the substrate are a magnetic shield layer 10 and a magnetic gap layer 20. On the magnetic gap layer 20 is a magnetoresistive film 30, which consists of a ferromagnetic film (free layer) 35, a copper layer 40, a ferromagnetic film (pinned layer) 65, and an antiferromagnetic film 70, which are formed sequentially one over another. The arrow 55 indicates the direction of magnetization. With the magnetoresistive film 30 patterned, there are arranged an electrode film 90 and a permanent magnet layer 80 at each side thereof. The top is covered with a magnetic gap layer 100 and a magnetic shield layer 110. The magnetoresistive film mentioned above is characterized in that the pinned layer has its magnetization pinned in the direction of element height (depth) by the exchange bias magnetic field from the antiferromagnetic layer. In general, the free layer has the axis of easy magnetization parallel to the cross-track direction (z direction) of the head.

In the case of the head mentioned above, it is desirable that the magnetization in the entire free layer be kept parallel to the cross-track direction of the head so that the free layer does not suffer magnetic saturation when a signal magnetic field from the medium is applied upward and downward in the direction of the element height of the head. Unfortunately, the magnetization in the free layer does not become uniformly parallel to the cross-track direction of the head because the free layer receives a static magnetic field which occurs as the pinned layer (orienting vertically to the medium surface) becomes magnetized. The result is that the head becomes sensitive unequally to the positive and negative magnetic fields and reproduces a large peak asymmetry of read-back waveform. This not only adversely affects the improvement of error rate by signal processing such as PRML (partial response sampling plus maximum likelihood detection) but also lowers the output. The peak asymmetry of read-back waveform is defined as follows.

$$\text{Asym.} = |V^+ - V^-|/|V^+ + V^-|$$

(where $V^+$ denotes the peak value of the positive output and $V^-$ denotes the peak value of the negative output.)

There is disclosed in Japanese Patent Laid-open No. 169026/1995 a giant magnetoresistive sensor designed to reduce the peak asymmetry of read-back waveform. As shown in FIG. 8, it has a magnetoresistive film 30 consisting of a ferromagnetic film (free layer) 35, a copper layer 40, a composite ferromagnetic film (pinned layer) 50, and an antiferromagnetic film 70. The pinned layer 50, which is a composite ferromagnetic film, consists of two ferromagnetic films 51 and 53 (of Co or the like) and a non-magnetic layer 52 (or Ru or the like), the former having their magnetization strongly coupled in the antiparallel direction through the latter. The two ferromagnetic films produce magnetic moments aligning in the antiparallel direction, thereby canceling out each other. The result is a reduction of static magnetic field applied to the free layer from the pinned layer. The second ferromagnetic film 53 of the pinned layer 50 has its magnetization pinned by the antiferromagnetic film 70.

There is disclosed in Japanese Patent Laid-open No. 7235/1996 another giant magnetoresistive sensor designed to reduce the peak asymmetry of read-back waveform. As shown in FIG. 9, it has a magnetoresistive film 30 consisting of a ferromagnetic film (free layer) 35, a copper layer 40, and a composite ferromagnetic film (pinned layer) 50. The pinned layer 50, which is a composite ferromagnetic film, consists of two ferromagnetic films 51 and 53 (of Co or the like) and a non-magnetic layer 52 (or Ru or the like), the former having their magnetization strongly coupled in the antiparallel direction through the latter, like the aforesaid head. The two ferromagnetic films 51 and 53 should have an adequate thickness, so that the pinned layer has a large effective coercive force for it to be of self-pinned type. The result is a reduction of static magnetic field applied from the pinned layer and obviation of the antiferromagnetic film to fix the pinned layer. The advantage is a reduction of the entire film thickness of the head and a reduction of the gap length.

On the other hand, there is disclosed in Japanese Patent Laid-open No. 347013/1993 and U.S. Pat. No. 5,287,238 a giant magnetoresistive sensor designed to increase its reproducing output. As shown in FIG. 10, it has a magnetoresistive film 30 consisting of a first antiferromagnetic layer 70, a first pinned ferromagnetic film 65, a non-magnetic film 40, a free ferromagnetic film 35, a non-magnetic layer 40, a second pinned ferromagnetic film 66, and a second antiferromagnetic film 71. The multi-layer structure, with the free layer being held between the pinned layers, causes electrons to scatter over a larger area of interface. This tends to a larger relative change of magnetoresistance ($\Delta R/R$ in percent) and a larger output of reproduction. This type of giant magnetoresistive sensor is called dual spin valve (SV) head.

Another type of dual spin valve (SV) head is disclosed in Japanese Patent Laid-open No. 225925/1995. As shown in FIG. 11, it has a magnetoresistive film 30 consisting of a first free magnetic film 35, a non-magnetic film 40, a first ferromagnetic pinned film 65, an antiferromagnetic film 70, a second ferromagnetic pinned layer 66, a non-magnetic film 40, and a second free magnetic film 36. As in the foregoing head, the multi-layer structure, with the antiferromagnetic film being held between the pinned layers and the free layers, causes electrons to scatter over a larger area of interface. This tends to a larger relative change of magnetoresistance ($\Delta R/R$ in percent).

SUMMARY OF THE INVENTION

The disadvantage of the aforesaid structure, with the free layer or antiferromagnetic film being held between two upper and lower pinned layers, is that the static magnetic field applied to the thickness of the free layer from the pinned layer increases as the pinned layer increases. Consequently, the direction of magnetization of the free layer deviates from the direction of the track width of the head, with the result that the peak asymmetry of reproduced signals becomes larger. The larger the asymmetry, the lower the read-back output.

A dual spin valve film to remedy the peak asymmetry of read-back waveform is described in "PtMn dual spin valve film with a Co/Ru/Co laminated ferri pinned magnetic layer", Synopsis of the $22^{nd}$ Lecture Meeting of Japan Institute of Applied Magnetism, p. 309. As shown in FIG. 12, it has a magnetoresistive film 30 consisting of a first antiferromagnetic film 70, a first composite ferromagnetic film (pinned layer) 50, a non-magnetic film 40, a ferromagnetic film (free layer) 35, a non-magnetic film 40, a second composite ferromagnetic film (pinned layer) 60, and a second antiferromagnetic film 71. The composite ferromagnetic films 50 and 60 have the same structure as the aforesaid composite film shown in FIG. 8. This structure is intended to reduce the static magnetic field from the pinned layer, thereby remedying the peak asymmetry of the read-back waveform of the head.

The disadvantage of the composite film functioning as the upper and lower pinned layers in the dual spin valve head is that the overall film thickness of the magnetic head increases. Any attempt to compensate the increased thickness by reduction in the thickness of the magnetic gap layers 20 and 100 shown in FIG. 7 ends up with an insufficient electro-static durability which leads to electro-static destruction due to short-circuits between the magnetoresistive film and shield film.

It is an object of the present invention to provide a giant magnetoresistive sensor of dual spin valve type which excels in electro-static durability and peak symmetry of read-back waveform.

The giant magnetoresistive sensor has a magnetoresistive film consisting of a substrate, a first free ferromagnetic film, a first non-magnetic film, a composite ferromagnetic film, a second non-magnetic film, and a second free ferromagnetic film, which are formed sequentially one over another, so that the composite ferromagnetic film becomes the pinned layer of self-pinned type. The pinned layer of self-pinned type consists of a first, second, and third ferromagnetic films antiferromagnetically coupled with one another and films separating these three ferromagnetic films and antiferromagnetically coupling them with one another.

According to the present invention, the giant magnetoresistive sensor may also have a magnetoresistive film consisting of a substrate, a first composite ferromagnetic film, a first non-magnetic film, a free ferromagnetic film, a second non-magnetic film, and a second composite ferromagnetic film, which are laminated one over another. The aforesaid first and second composite ferromagnetic films should be the pinned layer of self-pinned type. The pinned layer of self-pinned type consists of a first and second ferromagnetic films antiferromagnetically coupled with each other and a film separating these two ferromagnetic films and antiferromagnetically coupling them with each other. Either of the first and second composite ferromagnetic films may be replaced by the conventional pinned layer in which a singe pinned ferromagnetic film is pinned by an antiferromagnetic film.

The giant magnetoresistive sensor of the present invention is characterized in that the net amount of magnetic moment of the aforesaid composite ferromagnetic film can be made smaller than the total amount of magnetic moment of each ferromagnetic film in the composite ferromagnetic film. The composite film is regarded as one magnetic entity responsible for the net magnetic moment.

Also, the giant magnetoresistive sensor of the present invention may be constructed such that the first and second ferromagnetic films of the aforesaid magnetic composite layer have almost the same magnetic moment and consequently the net magnetic moment of the aforesaid composite ferromagnetic film is nearly null.

The giant magnetoresistive sensor of the present invention should have the aforesaid antiferromagnetic film such that it produces great unidirectional anisotropy regardless of the order of lamination of the antiferromagnetic film and the ferromagnetic film. It should preferably be made of nickel oxide, PtMn, PtPdMn, CrMnPt, or the like.

In addition, the giant magnetoresistive sensor of the present invention may be combined with a thin-film head of induction type for magnetic recording so as to constitute a thin-film magnetic head.

The giant magnetoresistive sensor of dual spin valve head type may have a composite film of self-pinned type as the pinned layer. The result is a reduction of static magnetic field from the pinned layer and hence a remedy for peak asymmetry of read-back waveform. Another result is a reduction of the total film thickness of the magnetoresistive film. This permits the insulating film between the magnetoresistive film and shield film to be thicker, and the thicker insulating film contributes to electro-static durability.

While the conventional dual spin valve head shown in FIG. 11 has the disadvantage that the scattering of electrons not contributing to the relative change of magnetoresistance takes place in the antiferromagnetic film 70, the giant magnetoresistive sensor of the present invention shown in FIG. 1 is free from this disadvantage owing to the two free layers formed on both sides of the self-pinned layer and hence it has a better relative change of magnetoresistance than the conventional one.

In addition, according to the present invention, it is possible to control the peak symmetry of read-back waveform if the static magnetic field applied to the free layer from the pinned layer is regulated by changing the difference in thickness of the two or three ferromagnetic films in the composite film of the pinned layer of self-pinned type.

DETAILED DESCRIPTION OF THE INVENTION

The invention will be described in more detail with reference to the following examples.

EXAMPLE 1

Figure 1A:
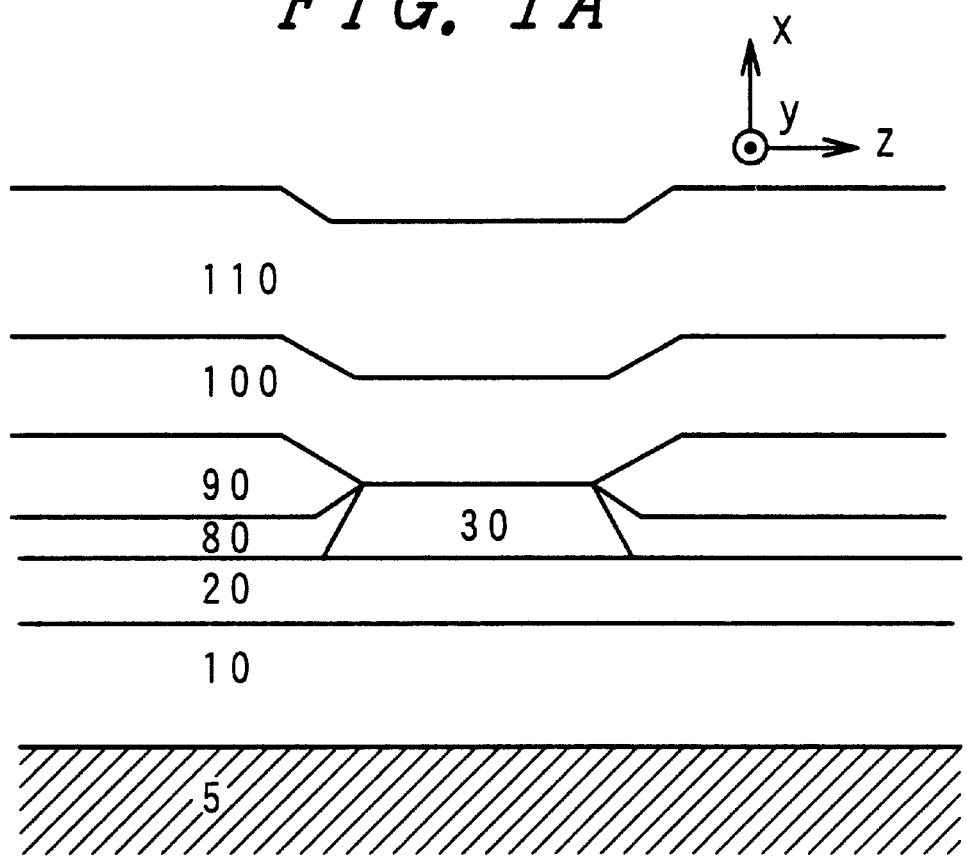
FIG. 1 is a sectional view of the giant magnetoresistive sensor in one embodiment of the present invention.
Figure 1B:
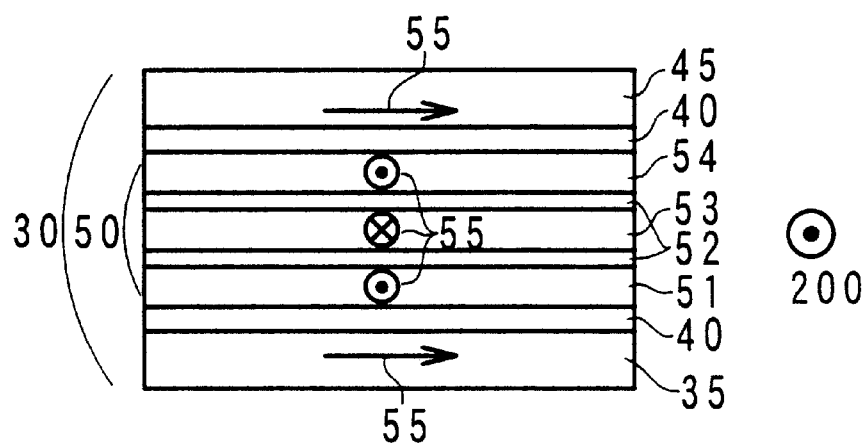

A typical giant magnetoresistive sensor of the present invention is shown in section in FIG. 1. There is shown a substrate 5. On the substrate 5 are formed sequentially a lower shield film (NiFe film) 10, an insulating film (Al$_2$O$_3$ film) 20 for magnetic gap, and a magnetoresistive film 30. The magnetoresistive film 30 is composed of a first free ferromagnetic film (NiFeCo) 35, a copper layer 40, a composite ferromagnetic film (pinned layer of self-pinned type) 50, a copper layer 40, and a second free ferromagnetic film (NiFeCo) 45, which are sequentially formed one over another. The composite ferromagnetic film (pinned layer of self-pinned type) 50 is composed of Co 51 (25 Å), Ru 52 (6 Å), Co 53 (30 Å), Ru 52 (6 Å), and Co 54 (25 Å), which are laminated sequentially. During lamination a magnetic field is applied in the direction of the arrow 200. Owing to the applied magnetic field, the composite ferromagnetic film has its axis of easy magnetization oriented in the direction perpendicular to the paper surface. An organic resist film is laminated, and then it is patterned as desired. A film of permanent magnet (CoCrPt film) 80 is laminated. It is fabricated in a desired shape. A layer of Nb/Au/Nb is laminated, and then it is fabricated to form an electrode 90. An insulating film (Al$_2$O$_3$ film) 100 for magnetic gap is formed. An upper shield film (NiFe film) 110 is laminated and then it is fabricated in a desired shape. Thus there is obtained a magnetic head. The electrode spacing Tw is 0.5 µm and the sensor height hMR is 0.4 µm.

The arrows 55 in the figure denote the direction of magnetization of each magnetic film. In the composite ferromagnetic film 50, the first, second, and third ferromagnetic films are strongly coupled with one another in an antiferromagnetic manner, and hence magnetization takes place in the direction shown. The composite ferromagnetic film 50 has a large effective coercive force and forms the pinned layer of self-pinned type.

Figure 7A:
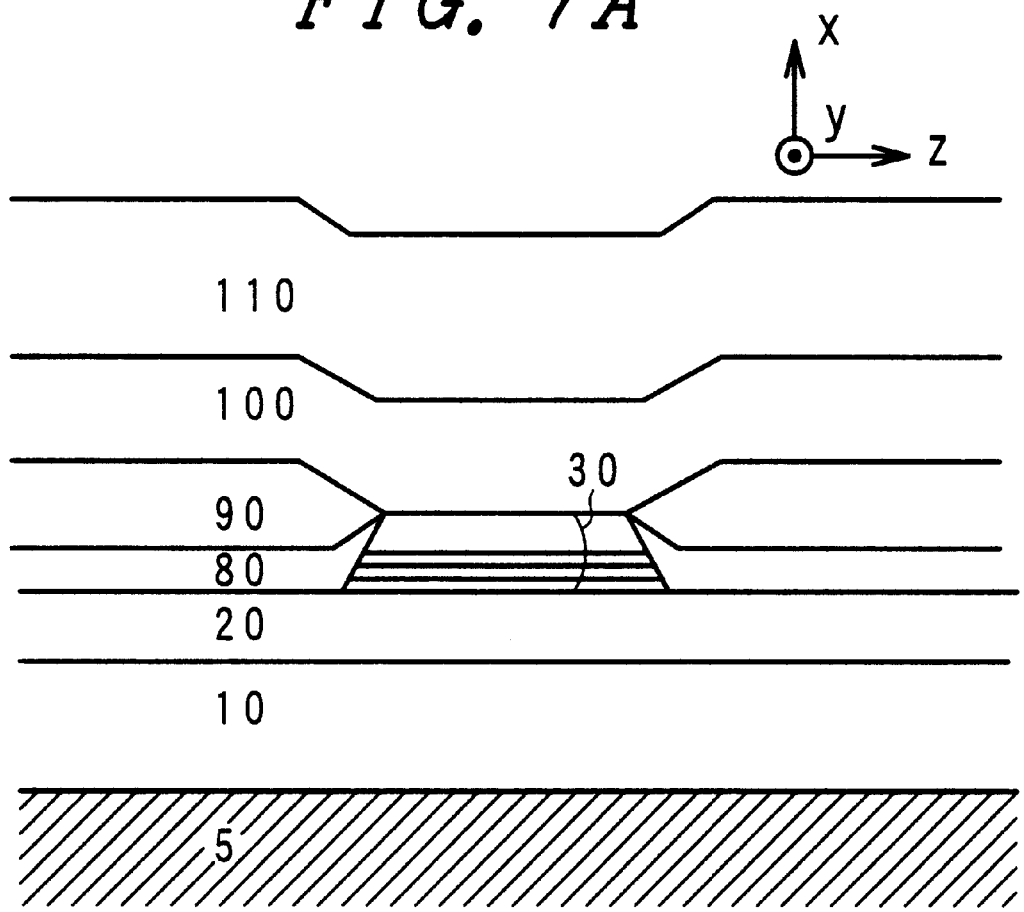
FIG. 7 is a sectional view of a conventional giant magnetoresistive sensor.
Figure 7B:
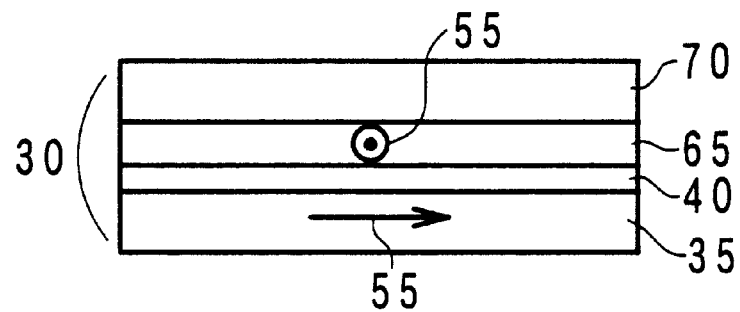
Figure 8:
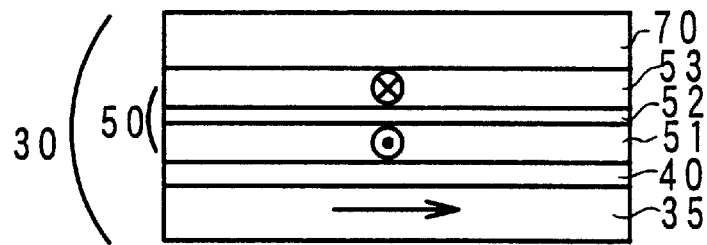
FIG. 8 is a sectional view showing a magnetoresistive film in a conventional giant magnetoresistive sensor with a pinned layer of composite film.
Figure 9:
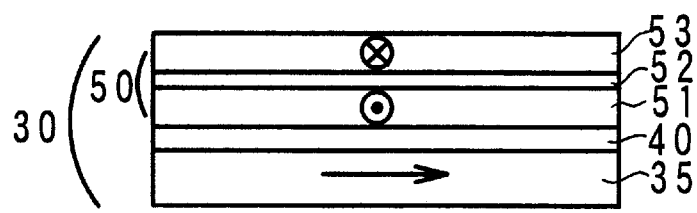
FIG. 9 is a sectional view showing a magnetoresistive film in a conventional giant magnetoresistive sensor with a pinned layer of composite film.
Figure 10:
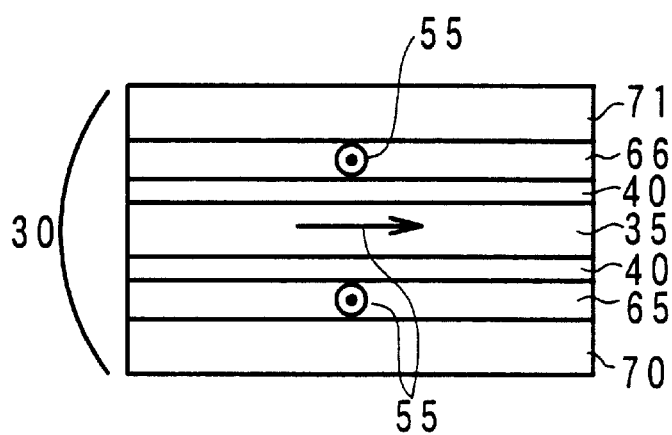
FIG. 10 is a sectional view showing a magnetoresistive film in a conventional giant magnetoresistive sensor of dual spin valve type.
Figure 11:
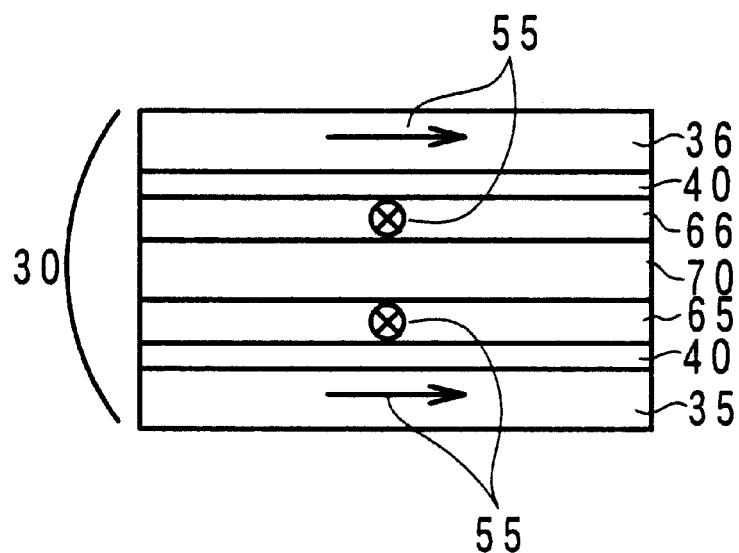
FIG. 11 is a sectional view showing a magnetoresistive film in a conventional giant magnetoresistive sensor of dual spin valve type.
Figure 12:
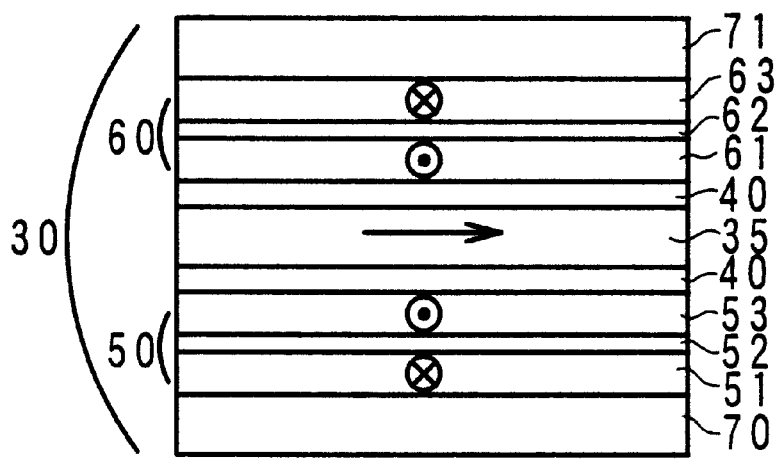
FIG. 12 is a sectional view showing a magnetoresistive film in a conventional giant magnetoresistive sensor of dual spin valve type.

The head of the present invention was compared with a giant magnetoresistive sensor of conventional type which has the same electrode spacing and sensor height (shown in FIG. 7). It was found that the head of the present invention produces 1.5 times as large read-back output as the conventional one.

Figure 13A:
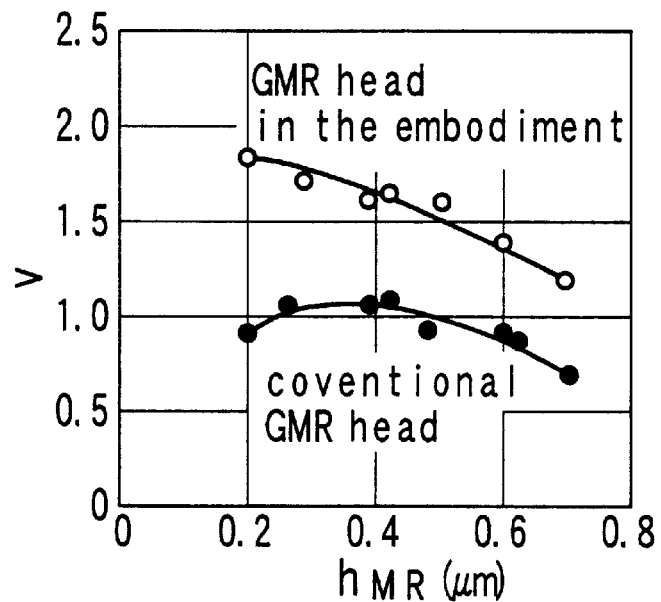
FIG. 13 is a graph showing the dependence of the normalized output and peak asymmetry of read-out waveform on the sensor height hMR in the giant magnetoresistive sensor in the example of the present invention.
Figure 13B:
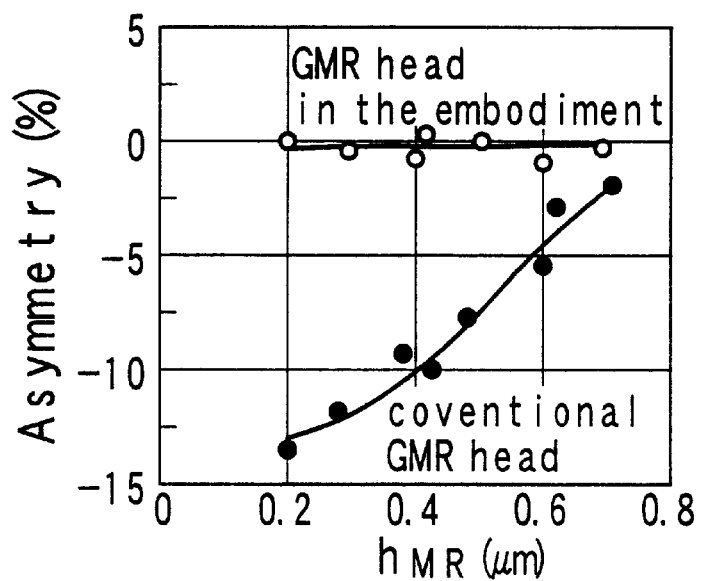

A large number of heads varying in hMR were prepared, and they were tested for peak-asymmetry of read-back waveform (Asym.) and read-back output. The results are shown in FIG. 13. Asym. is defined as follows:

$$\text{Asym.} = |V^+ - V^-|/|V^+ + V^-|$$

(where $V^+$ denotes the peak value of the positive output and $V^-$ denotes the peak value of the negative output.) The read-back output is the value normalized such that the value of the conventional head (with hMR being 0.4 µm) is 1. In the case of the conventional head, it is difficult to make Asym. null. In addition, Asym. greatly changes as hMR changes. By contrast, the head of the present invention keeps Asym. almost null. Even when hMR changes from 0.2 µm to 0.7 µm, Asym. changes very little. This makes it possible to reduce the fluctuation of Asym. due to tolerance of hMR. The read-back output is about 1.5 times larger than that in the conventional case. As mentioned above, this example gives a giant magnetoresistive sensor with small peak asymmetry and large read-back output. In addition, this example gives a giant magnetoresistive sensor superior in electro-static durability.

EXAMPLE 2

This example demonstrates another giant magnetoresistive sensor which differs in the thickness of the pinned layer from the one in Example 1. As in Example 1 shown in FIG. 1, it consists of a substrate 5, a lower shield film (NiFe film) 10, an insulating film (Al$_2$O$_3$) 20 for magnetic gap, and a magnetoresistive film 30. The magnetoresistive film 30 consists of a first free ferromagnetic layer (NiFeCo) 35, a copper layer 40, a composite ferromagnetic film (pinned layer of self-pinned type) 50, and a copper layer 40, and a second free ferromagnetic film NiFeCo) 55, which are laminated sequentially. The composite ferromagnetic film (pinned layer of self-pinned type) 50 consists of Co 51 (20 Å), Ru 52 (6 Å), Co 53 (35 Å), Ru 52 (6 Å), and Co 54 (20 Å), which are laminated sequentially. During lamination a magnetic field is applied in the direction of the arrow 200. Owing to the applied magnetic field, the composite ferromagnetic film has its axis of easy magnetization oriented in the direction perpendicular to the paper surface. An organic resist film is laminated, and then it is patterned as desired. A film of permanent magnet (CoCrPt film) 80 is laminated. It is fabricated in a desired shape. A layer of Nb/Au/Nb is laminated, and then it is fabricated to form an electrode 90. An insulating film (Al$_2$O$_3$ film) 100 for magnetic gap is formed. An upper shield film (NiFe film) 110 is laminated and then it is fabricated in a desired shape. Thus there is obtained a magnetic head. The electrode spacing Tw is 0.5 µm and the sensor height hMR is 0.4 µm.

It was found that in this example, too, the composite ferromagnetic film 50 has a large effective coercive force and forms the pinned layer of self-pinned type for stable operation. It was also found that the giant magnetoresistive sensor produces 1.5 times as large read-back output as the conventional one and has good electro-static durability and good Asym.

EXAMPLE 3

Figure 2A:
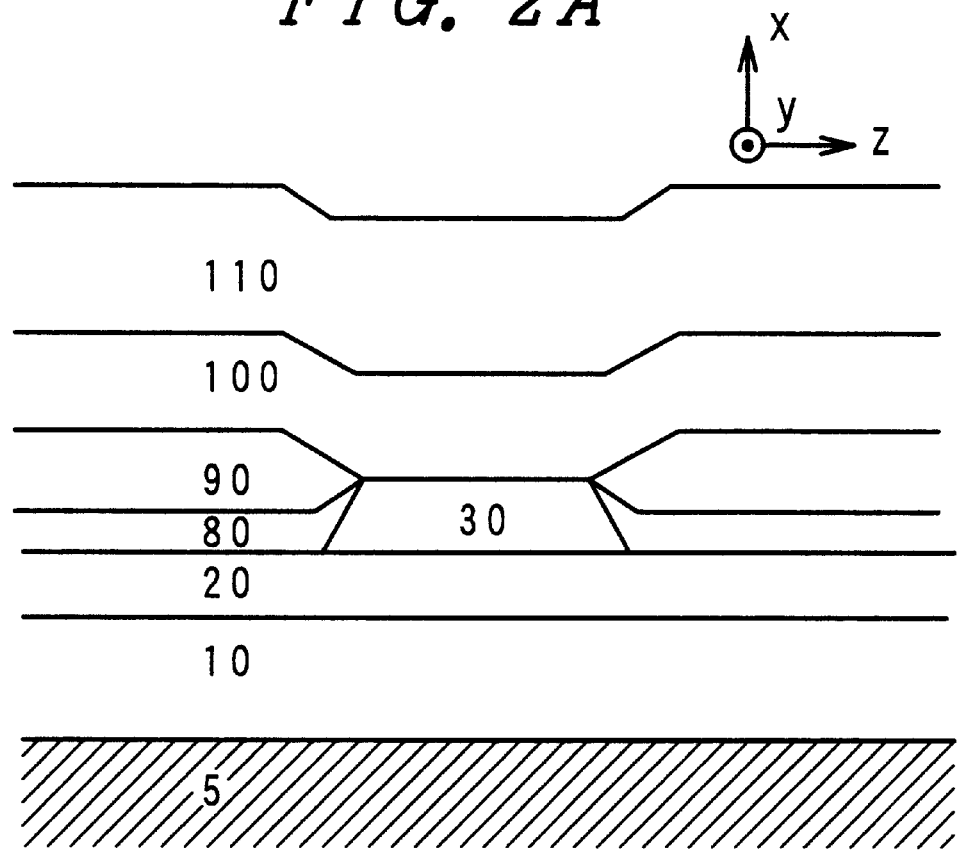
FIG. 2 is a sectional view of the giant magnetoresistive sensor in another embodiment of the present invention.
Figure 2B:
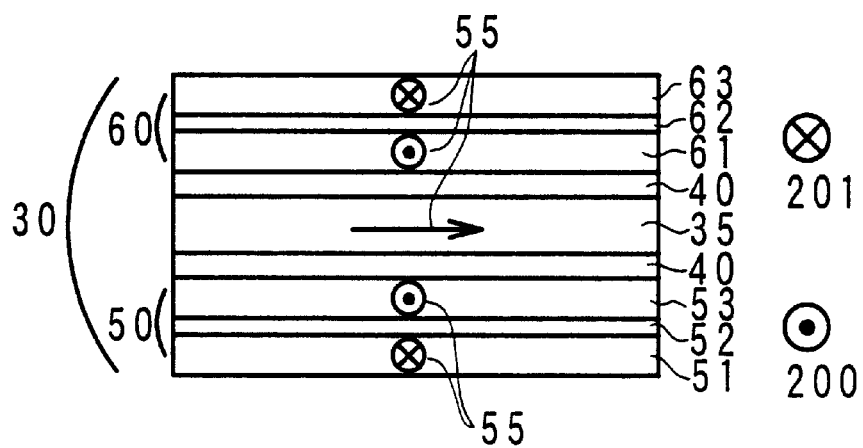

This example demonstrates another giant magnetoresistive sensor whose sectional view is shown in FIG. 2. It consists of a substrate 5, a lower shield film (NiFe film) 10, an insulating film (Al$_2$O$_3$) 20 for magnetic gap, and a magnetoresistive film 30. The magnetoresistive film 30 consists of a first composite ferromagnetic film (pinned layer) 50, a copper layer 40, a free ferromagnetic film (NiFeCo) 35, a copper layer 40, and a second composite ferromagnetic film (pinned layer) 60, which are laminated sequentially. The first composite ferromagnetic film (pinned layer) 50 consists of Co 51 (20 Å), Ru 52 (6 Å), and Co 53 (35 Å), which are laminated sequentially. During lamination a magnetic field is applied in the direction of the arrow 200. Owing to the applied magnetic field, the composite ferromagnetic film 50 has its axis of easy magnetization oriented in the direction perpendicular to the paper surface. The Co film 51 and the Co film 53 are strongly coupled with each other in an antiferromagnetic manner, and hence magnetization takes place in the direction shown. The composite ferromagnetic film 50 has a large effective coercive force and forms the pinned layer of self-pinned type. Likewise, the second composite ferromagnetic film (pinned layer) 60 consists of Co 61 (20 Å), Ru 62 (6 Å), and Co 63 (35 Å), which are laminated sequentially. During lamination a magnetic field is applied in the direction of the arrow 201. Owing to the applied magnetic field, the composite ferromagnetic film 60 has its axis of easy magnetization oriented in the direction perpendicular to the paper surface, and magnetization takes place in the direction shown. As in the case of the composite ferromagnetic film 50, the composite ferromagnetic film 60 forms the pinned layer of self-pinned type. The first and second ferromagnetic composite films produce effective magnetic moments in their antiparallel direction. This cancels out the magnetic field applied to the free layer from the composite ferromagnetic film.

Subsequently, an organic resist film is laminated, and then it is patterned as desired. A film of permanent magnet (CoCrPt film) 80 is laminated. It is fabricated in a desired shape. A layer of Nb/Au/Nb is laminated, and then it is fabricated to form an electrode 90. An insulating film ($Al_2O_3$ film) 100 for magnetic gap is formed. An upper shield film (NiFe film) 110 is laminated and then it is fabricated in a desired shape. Thus there is obtained a magnetic head. The electrode spacing Tw is 0.5 μm and the sensor height hMR is 0.4 μm.

It was found that in this example, too, the giant magnetoresistive sensor produces 1.5 times as large read-back output as the conventional one and has good electro-static durability and good Asym.

Further, this example also demonstrates another giant magnetoresistive sensor which is identical in structure with the above-mentioned one, except that the thickness of the Co film in the first and second composite ferromagnetic film varies so that the effective magnetic moment of the composite ferromagnetic film varies. In the first case, the first and second composite ferromagnetic films produce the effective magnetic moment in the same direction. In the second case, the first and second magnetic composite layers have the two Co films of the same thickness so that their effective magnetic moment is nearly null. In the third case, either of the composite ferromagnetic films has an effective magnetic moment which is almost null. In all the cases, the resulting giant magnetoresistive sensor produces a large read-back output and has good electro-static durability and good Asym.

EXAMPLE 4

Figure 3A:
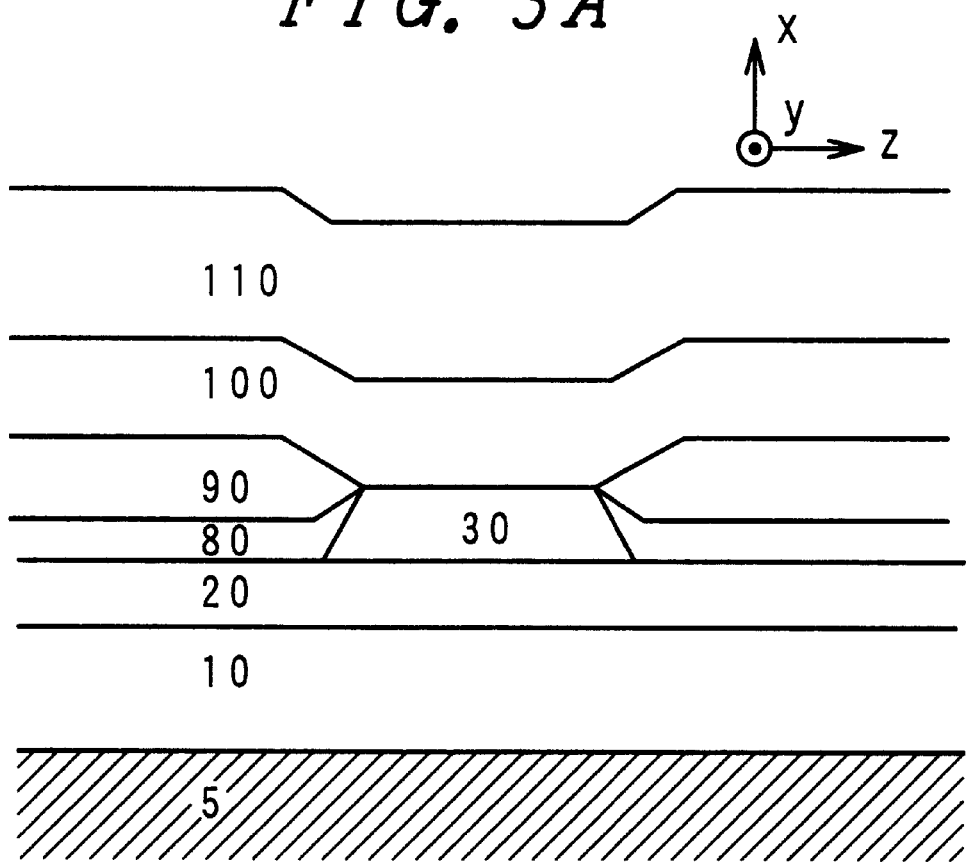
FIG. 3 is a sectional view of the giant magnetoresistive sensor in another embodiment of the present invention.
Figure 3B:
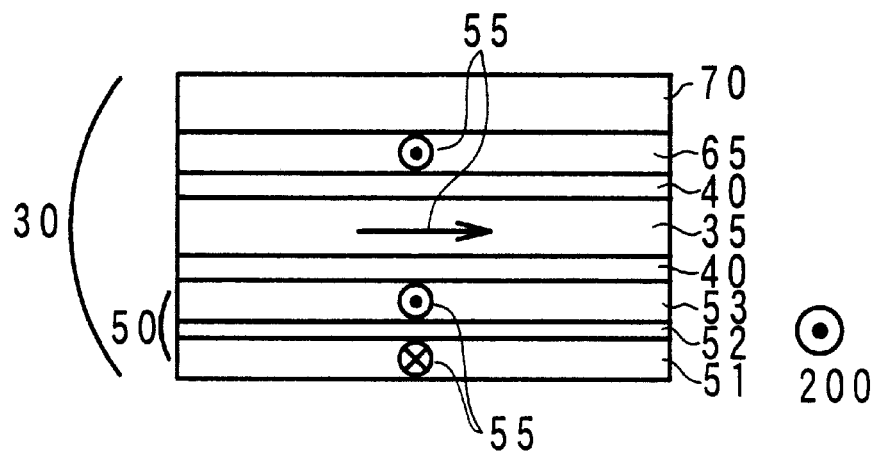

This example demonstrates another giant magnetoresistive sensor whose sectional view is shown in FIG. 3. It consists of a substrate 5, a lower shield film (NiFe film) 10, an insulating film ($Al_2O_3$) 20 for magnetic gap, and a magnetoresistive film 30. The magnetoresistive film 30 consists of a composite ferromagnetic film (pinned layer) 50, a copper layer 40, a free ferromagnetic film NiFeCo) 35, a copper layer 40, a pinned ferromagnetic film (CoFe) 65, and an antiferromagnetic film (CrMnPt) 70, which are laminated sequentially. The composite ferromagnetic film (pinned layer) 50 consists of Co 51 (20 Å), Ru 52 (6 Å), and Co 53 (35 Å), which are laminated sequentially. During lamination a magnetic field is applied in the direction of the arrow 200. Owing to the applied magnetic field, the composite ferromagnetic film 50 has its axis of easy magnetization oriented in the direction perpendicular to the paper surface. The Co film 51 and the Co film 53 are strongly coupled with each other in an antiferromagnetic manner, so that they form a pinned layer of self-pinned type. Subsequently, an organic resist film is laminated, and then it is patterned as desired. A film of permanent magnet (CoCrPt film) 80 is laminated. It is fabricated in a desired shape. A layer of Nb/Au/Nb is laminated, and then it is fabricated to form an electrode 90. An insulating film ($Al_2O_3$ film) 100 for magnetic gap is formed. An upper shield film (NiFe film) 110 is laminated and then it is fabricated in a desired shape. Thus there is obtained a magnetic head. The electrode spacing Tw is 0.5 μm and the sensor height hMR is 0.4 μm.

In this example, the pinned ferromagnetic layer 65 is magnetized in the direction of the arrow 55. However, this direction may be reversed (180°).

It was found that the giant magnetoresistive sensor in this example produces 1.5 times as large read-back output as the conventional one and has good electro-static durability and good Asym.

Further, this example also demonstrates another giant magnetoresistive sensor which is identical in structure with the above-mentioned one, except that the thickness of the ferromagnetic film is changed (Co 20 Å, Ru 6 Å, Co 25 Å) so that the effective magnetic moment of the composite ferromagnetic film 50 is almost null. The giant magnetoresistive sensor produces a large read-back output and has good electro-static durability and good Asym.

EXAMPLE 5

Figure 4A:
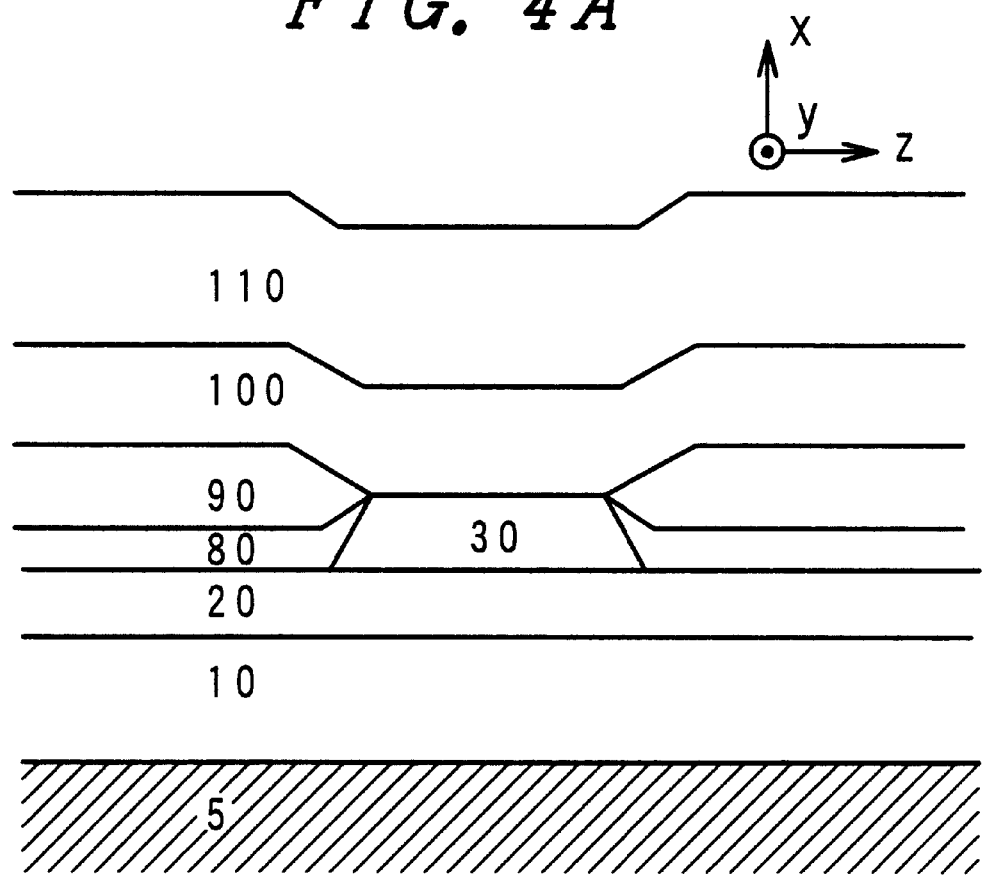
FIG. 4 is a sectional view of the giant magnetoresistive sensor in another embodiment of the present invention.
Figure 4B:
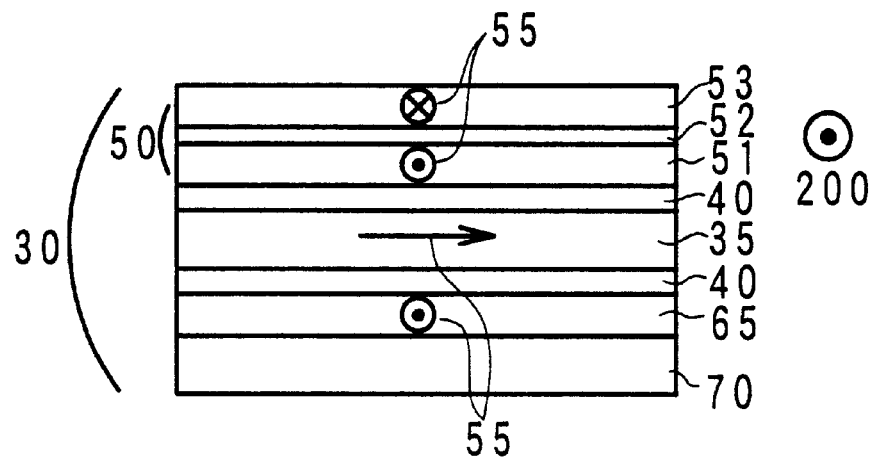

This example demonstrates another giant magnetoresistive sensor whose sectional view is shown in FIG. 4. It consists of a substrate 5, a lower shield film (NiFe film) 10, an insulating film ($Al_2O_3$) 20 for magnetic gap, and a magnetoresistive film 30. The magnetoresistive film 30 consists of an antiferromagnetic layer (CrMnPt) 70, a pinned ferromagnetic layer (CoFe) 65, a copper layer 40, a free ferromagnetic layer (NiFeCo) 35, a copper layer 40, and a composite ferromagnetic film (pinned layer) 50, which are laminated sequentially. The composite ferromagnetic film (pinned layer) 50 consists of Co 51 (35 Å), Ru 52 (6 Å), and Co 53 (20 Å), which are laminated sequentially. During lamination a magnetic field is applied in the direction of the arrow 200. Owing to the applied magnetic field, the composite ferromagnetic film 50 has its axis of easy magnetization oriented in the direction perpendicular to the paper surface. The Co film 51 and the Co film 53 are strongly coupled with each other in an antiferromagnetic manner, so that they form a pinned layer of self-pinned type. Subsequently, an organic resist film is laminated, and then it is patterned as desired. A film of permanent magnet (CoCrPt film) 80 is laminated. It is fabricated in a desired shape. A layer of Nb/Au/Nb is laminated, and then it is fabricated to form an electrode 90. An insulating film ($Al_2O_3$ film) 100 for magnetic gap is formed. An upper shield film (NiFe film) 110 is laminated and then it is fabricated in a desired shape. Thus there is obtained a magnetic head. The electrode spacing Tw is 0.5 μm and the sensor height hMR is 0.4 μm.

In this example, the pinned ferromagnetic layer 65 is magnetized in the direction of the arrow 55. However, this direction may be reversed (180°). The composite ferromagnetic film 50 produces an effective coercive force and hence forms the pinned layer of self-pinned type.

It was found that the giant magnetoresistive sensor in this example produces 1.5 times as large read-back output as the conventional one and has good electro-static durability and good Asym.

Further, this example also demonstrates another giant magnetoresistive sensor which is identical in structure with the above-mentioned one, except that the thickness of the ferromagnetic layer is changed (Co 25 Å, Ru 6 Å, Co 20 Å) so that the effective magnetic moment of the composite ferromagnetic film 50 is almost null. The giant magnetoresistive sensor produces a large read-back output and has good electro-static durability and good Asym.

EXAMPLE 6

This example demonstrates another giant magnetoresistive sensor having an antiferromagnetic layer as in Example 4. It consists of a substrate, a lower shield film (NiFe film) 5, an insulating film ($Al_2O_3$) 10 for magnetic gap, and a magnetoresistive film 30. The magnetoresistive film 30 consists of a composite ferromagnetic film (pinned layer) 50, a copper layer 40, a pinned ferromagnetic layer (CoFe) 65, and an antiferromagnetic layer (PtMn) 70, which are laminated sequentially. The composite ferromagnetic film (pinned layer) 50 consists of Co 51 (20 Å), Ru 52 (6 Å), and Co 53 (35 Å), which are laminated sequentially. The composite ferromagnetic film 50 has its axis of easy magnetization oriented in the direction perpendicular to the paper surface. The Co film 51 and the Co film 53 are strongly coupled with each other in an antiferromagnetic manner, so that they form a pinned layer of self-pinned type. Subsequently, an organic resist film is laminated, and then it is patterned as desired. A film of permanent magnet (CoCrPt film) 80 is laminated. It is fabricated in a desired shape. A layer of Nb/Au/Nb is laminated, and then it is fabricated to form an electrode. An insulating film ($Al_2O_3$ film) for magnetic gap is formed. An upper shield film (NiFe film) is laminated and then it is fabricated in a desired shape. Thus there is obtained a magnetic head.

The giant magnetoresistive sensor in this example produces 1.5 times as large read-back output as the conventional one and has good electro-static durability and good Asym.

EXAMPLE 7

Figure 5:
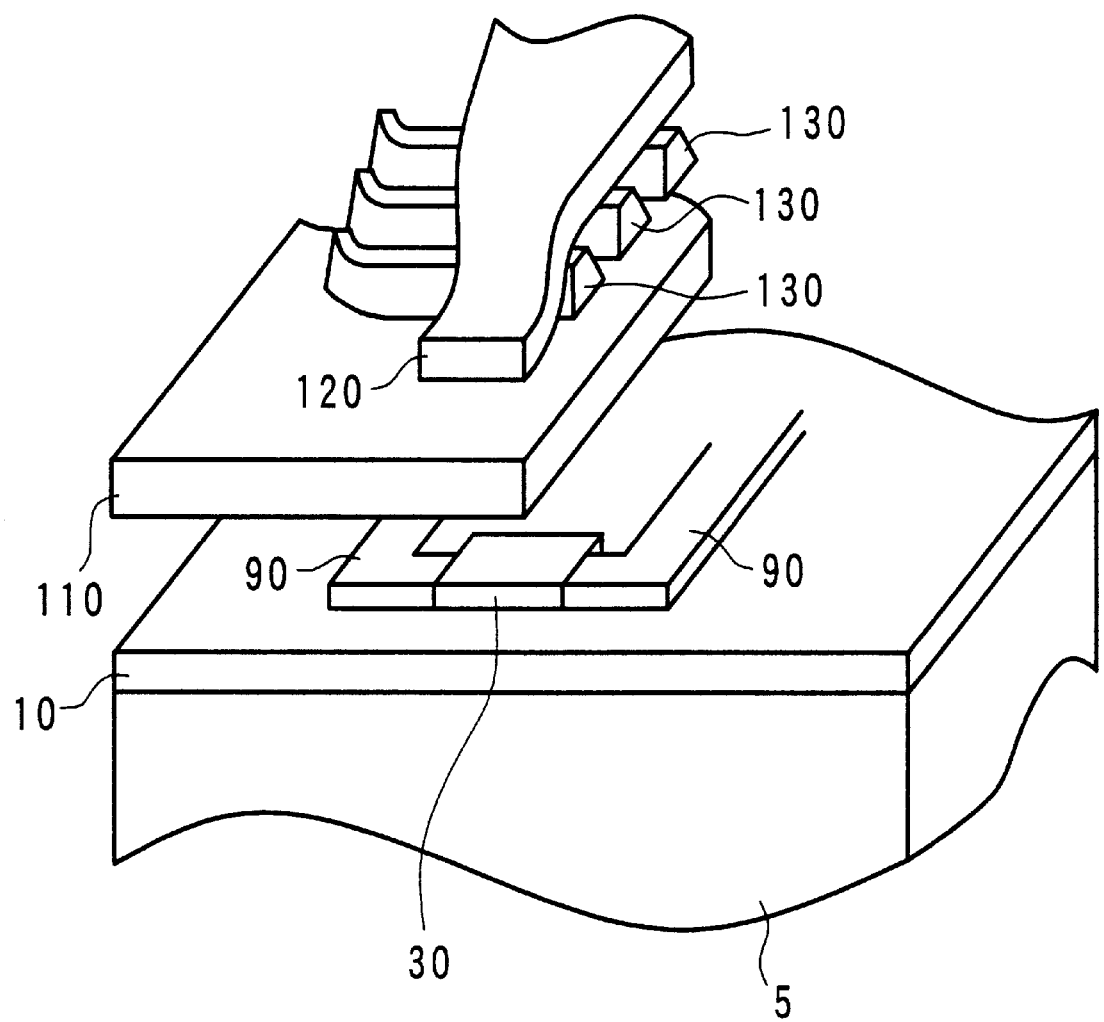
FIG. 5 is a perspective view showing the structure of the thin-film magnetic head equipped with the giant magnetoresistive sensor of the present invention.

This example demonstrates a thin-film magnetic head (of read/write separate type) in which the magnetoresistance element of the present invention is used as the reading head and the conventional inductive thin-film head is used as the writing head. FIG. 5 is a partly cut away perspective view showing this thin-film magnetic head. There is shown a substrate 5 (as a slider) which is a sintered body composed mainly of $Al_2O_3$.TiC. On the substrate are formed a lower shield film 10 and an insulating film ($Al_2O_3$ film) for magnetic gap. On them is further formed a magnetoresistive film 30, which consists of a first free ferromagnetic film (NiFeCo), a copper layer, a composite ferromagnetic film (pinned layer of self-pinned type), a copper layer, and a second free ferromagnetic film (NiFeCo), which are laminated sequentially. The ferromagnetic composite film (pinned layer of self-pinned type) is composed of Co (20 Å), Ru (6 Å), Co (35 Å), Ru (6 Å), and Co (20 Å), which are laminated sequentially. Subsequently, an organic resist film is laminated, and then it is patterned as desired. A film of permanent magnet (CoCrPt film) is laminated. It is fabricated in a desired shape. A layer of Nb/Au/Nb is laminated, and then it is fabricated to form an electrode. An insulating film ($Al_2O_3$ film) for magnetic gap is formed. A magnetic shield film (NiFe film) 110 is formed. The part produced as mentioned above functions as the reading head.

An inductive thin-film head is formed as the magnetic writing head, which consists of an upper magnetic pole 120 and a coil 130. The upper magnetic pole 120 is a 3.0-$\mu$m thick film of Ni-20 at % Fe alloy which is formed by sputtering. The gap between the upper shield film 110 and the upper magnetic pole 120 is filled with a 0.2-$\mu$m thick $Al_2O_3$ film formed by sputtering. The coil 130 is a 3.0-$\mu$m thick copper film. The lower magnetic pole 110 and the upper magnetic pole 120 are magnetically connected with each other to form a magnetic circuit. The coil 130 intersects the magnetic circuit.

It was found that the thin-film magnetic head of this example produces 1.5 times as large read-back output as the conventional one and has good peak symmetry of read-back waveform, with Asym. depending on hMR very little.

EXAMPLE 8

Figure 6A:
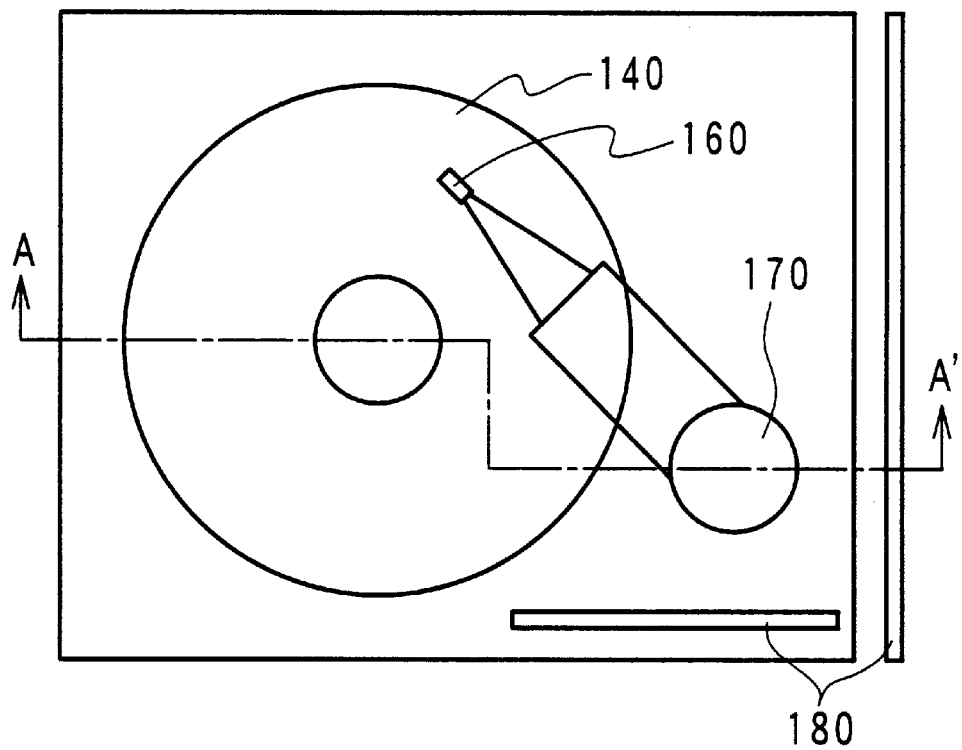
FIG. 6 is a schematic drawing of the read/write apparatus.
Figure 6B:
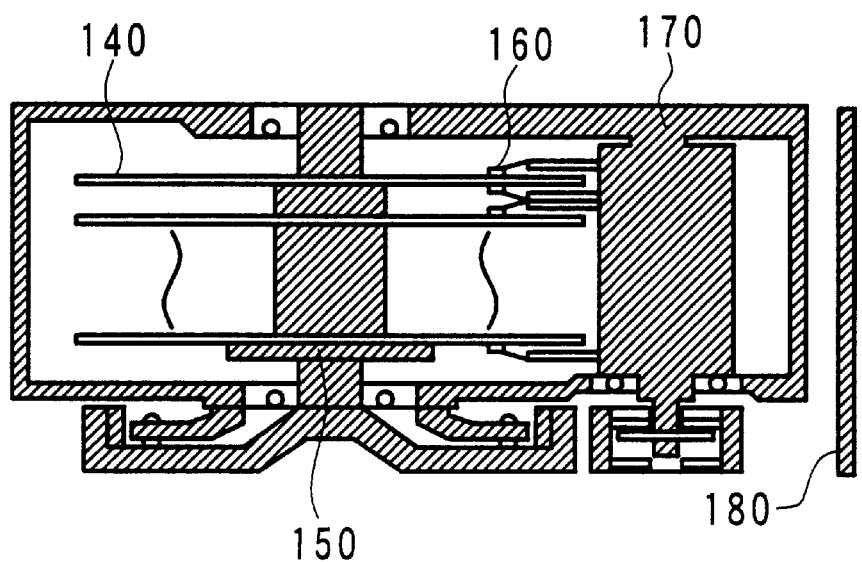

This example demonstrates a magnetic disk apparatus equipped with the magnetic head produced in the aforesaid examples of the present invention. It is schematically shown in FIG. 6.

There is shown a magnetic recording medium 140, which is made of a Co—Ni—Pt—Ta alloy having a residual magnetic flux density of 0.45 T. The magnetic recording medium 140 is driven by a drive unit 150. The magnetic head 160 is driven by the drive unit 170 so that it selects any track on the magnetic recording medium 140. Signals for the magnetic head 160 are processed by the read/write signal processing system 180.

The magnetoresistive sensor built into the magnetic head 160 produces a larger reproduction output and better peak symmetry of read-back waveform than the magnetoresistive sensor of conventional structure. Therefore, the magnetic disk apparatus equipped with it has a narrow track width and a high recording density.

As mentioned above, the present invention provides a giant magnetoresistive sensor which produces a large reproduction output, good peak symmetry of read-back waveform, and good electro-static durability.

What is claimed is:

1. A giant magnetoresistive sensor having a magnetoresistive film, a pair of electrodes to supply electric current to said magnetoresistive film, and magnetic shield films formed on the upper and lower sides of said magnetoresistive film, characterized in that said magnetoresistive film is composed of a first free ferromagnetic film, a first non-magnetic film, a composite ferromagnetic film, a second non-magnetic film, and a second free ferromagnetic film, which are laminated sequentially, and said composite ferromagnetic film contains a first, second, and third ferromagnetic films, which are antiferromagnetically coupled with one another, and also contains films which separate said ferromagnetic films from one another and antiferromagnetically couple them with one another.

2. A giant magnetoresistive sensor as defined in claim 1, wherein the net magnetic moment of said composite ferromagnetic film is smaller than the magnetic moments in total of the first, second, and third ferromagnetic films constituting said composite ferromagnetic film.

3. A giant magnetoresistive sensor as defined in claim 1, wherein the total amount of magnetic moment of the first and third ferromagnetic films of said composite ferromagnetic film is approximately equal to the magnetic moment of the second ferromagnetic film.

4. A giant magnetoresistive sensor having a magnetoresistive film, a pair of electrodes to supply electric current to said magnetoresistive film, and magnetic shield films formed on the upper and lower sides of said magnetoresistive film, characterized in that said magnetoresistive film is composed of a first composite ferromagnetic film, a first non-magnetic film, a free ferromagnetic film, and a second composite ferromagnetic film, which are laminated sequentially, and said first composite ferromagnetic film and said second composite ferromagnetic film contain a first and second ferromagnetic films, which are antiferromagnetically coupled with each other, and also contain films which separate said ferromagnetic films from each other and antiferromagnetically couple them with each other.

5. A giant magnetoresistive sensor as defined in claim 4, wherein the net magnetic moment of said first composite ferromagnetic film is smaller than the magnetic moments in total of the first and second magnetic films constituting said first composite ferromagnetic film and the net magnetic moment of said second composite ferromagnetic film is smaller than the magnetic moments in total of the first and second magnetic films constituting said second composite ferromagnetic film.

6. A giant magnetoresistive sensor as defined in claim 4, wherein the magnetic moments of the first and second ferromagnetic films of said first or second composite ferromagnetic films are approximately equal to each other.

7. A thin-film read/write head which comprises an inductive thin-film head for magnetic recording and a giant magnetoresistive sensor as defined in claim 1, said inductive thin-film head having a pair of magnetic poles, a magnetic circuit to magnetically couple said pair of magnetic poles, and a coil intersecting said magnetic circuit.

8. A magnetic recording apparatus which comprises a magnetic recording medium, a thin-film magnetic head mentioned in claim 7, a drive means to drive said magnetic recording medium and said head relatively to each other, and a read/write signal processor connected to said head.

* * * * *